United States Patent
Baniecki et al.

(10) Patent No.: US 7,026,680 B2
(45) Date of Patent: Apr. 11, 2006

(54) THIN FILM CAPACITIVE ELEMENT, METHOD FOR PRODUCING SAME AND ELECTRONIC DEVICE

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/790,760

(22) Filed: Mar. 3, 2004

(65) Prior Publication Data

US 2004/0178436 A1    Sep. 16, 2004

(30) Foreign Application Priority Data

Mar. 12, 2003   (JP) ............................. 2003-066787

(51) Int. Cl.
*H01L 27/108*  (2006.01)
*H01L 29/76*   (2006.01)

(52) U.S. Cl. ..................... 257/310; 257/296; 257/516
(58) Field of Classification Search ................ 257/310, 257/296, 516
See application file for complete search history.

(56) References Cited

U.S. PATENT DOCUMENTS

| | | | |
|---|---|---|---|
| 5,520,992 A * | 5/1996 | Douglas et al. ............. | 428/209 |
| 6,212,057 B1 * | 4/2001 | Kohara et al. ............ | 361/301.4 |
| 6,251,720 B1 * | 6/2001 | Thakur et al. ............. | 438/240 |
| 2001/0021564 A1 * | 9/2001 | Katori ....................... | 438/396 |
| 2003/0161091 A1 * | 8/2003 | Devoe et al. ............. | 361/321.2 |

FOREIGN PATENT DOCUMENTS

| | | |
|---|---|---|
| EP | 0 961 311 A2 | 8/2002 |
| JP | 10-12821 | 1/1998 |
| JP | 2000-49311 | 2/2000 |
| JP | 2002-532889 | 10/2002 |
| WO | WO 96/02067 | 1/1996 |
| WO | WO 00/35042 | 6/2000 |

* cited by examiner

*Primary Examiner*—Tu-Tu Ho
(74) *Attorney, Agent, or Firm*—Westerman, Hattori, Daniels & Adrian, LLP

(57) ABSTRACT

An integrated thin film capacitive element comprising a dielectric material of the specified composition that exhibits increased voltage tunability of capacitance and capacitance density and a production process thereof are disclosed. The integrated thin film capacitive element comprises a capacitor structure constituted from a lower electrode, a dielectric layer comprised of the high dielectric constant material represented by the formula: $(Ba_{(1-y)(1-x)}Sr_{(1-y)x}Y_y)Ti_{1+z}O_{3+\delta}$ with the range $0<x<1$, $0.007<y<0.02$, $-1<\delta<0.5$, and $(Ba_{(1-y)(1-x)}+Sr_{(1-y)x})/Ti_{1+z}<1$, and an upper electrode. An electronic device comprising the capacitive element of the present invention is also disclosed.

30 Claims, 7 Drawing Sheets

THIN FILM CAPACITIVE ELEMENT, METHOD FOR PRODUCING SAME AND ELECTRONIC DEVICE

CROSS-REFERENCE TO RELATED APPLICATIONS

This application is based on and claims priority from Japanese Patent Application No. 2003-66787, filed on Mar. 12, 2003, the contents being incorporated herein by reference.

BACKGROUND OF THE INVENTION

1. Field of the Invention

The present invention relates to a capacitive element and, particularly, an integrated capacitive element. In particular, the present invention relates to an integrated thin film capacitive element which comprises a substrate such as semiconductor substrate having at least one capacitor structure formed by using a thin film fabrication process. The present invention also relates to a method for producing the capacitive element of the present invention and an electronic device using the capacitive element of the present invention.

2. Description of the Related Art

Recently, the increased processing speeds of LSIs have led to the development of decoupling as a strategy for preventing diffusion of high-frequency noise, and an improvement of the high-frequency tracking performance of the decoupling capacitors used is now desired.

To achieve an improved high-frequency tracking performance of decoupling capacitors, the decoupling capacitors must have characteristics such as high capacitance and low impedance connections in distributed circuits, and it is known that this requirement can be achieved by forming thin film capacitors on a semiconductor substrate by a thin film fabrication process. The thin film capacitors are also called thin film capacitive elements or devices.

Because the thin film capacitors are miniature, have large capacities and are excellently suited for microprocessing, they can be connected with a circuit board through a bump connection with narrow pitches between terminals, thereby reducing mutual inductance and making possible effective low-inductance connections with LSIs. Generally, the thin film capacitors comprise a substrate having applied thereon a capacitor structure consisting of a dielectric layer sandwiched between a lower electrode layer and an upper electrode layer. One example of the thin film capacitors having such a structure is disclosed in Japanese Unexamined Patent Publication (Kokai) No. 2000-49311. In the capacitive device disclosed in JPP'311, a lower electrode, a capacitive insulating layer consisting of insulating metal oxide which is a ferroelectric or high dielectric material, an upper electrode and a protective insulating layer are formed in this order on a substrate. In this capacitive device, the protective insulating layer has contact holes to connect the lower electrode to a wiring circuit thereof and to connect the upper electrode to a wiring circuit thereof, and the contact holes have an opening area of not more than 5 µm². The capacitive device can solve the problem that a metal oxide used in the formation of the dielectric layer can be reduced during production of the capacitive device, thereby causing deterioration in electrical characteristics of the resulting device.

With regard to the metal oxide constituting the dielectric layer of the thin film capacitive elements, thin film $ABO_3$ perovskite type dielectric materials such as barium strontium titanate are currently being investigated as voltage tunable capacitive elements for applications in microwave and RF devices and as charge storage devices for decoupling capacitor and DRAM applications. For these applications, a high voltage tunability of capacitance $\Delta C(V)$ and/or high capacitance density is required. $\Delta C(V)$ can be defined as $\Delta C(V) = 100 \times (C_{max} - C_{min})/C_{min}$ where $C_{max}$ is the maximum in capacitance density and $C_{min}$ the minimum capacitance density over the operating voltage.

SUMMARY OF THE INVENTION

In one aspect thereof, the present invention resides in a thin film capacitive element comprising a substrate having applied thereon a capacitor structure constituted from a lower electrode, a dielectric layer formed on the lower electrode and an upper electrode formed on the dielectric layer, in which the dielectric layer comprises a high dielectric constant material represented by the following formula (I):

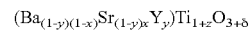

$$(Ba_{(1-y)(1-x)}Sr_{(1-y)x}Y_y)Ti_{1+z}O_{3+\delta}$$

wherein $0 < x < 1$, $0.007 < y < 0.02$, $-1 < \delta < 0.5$, and $(Ba_{(1-y)(1-x)} + Sr_{(1-y)x})/Ti_{1+z} < 1$.

In another aspect thereof, the present invention resides in a process for the production of a thin film capacitive element comprising a substrate having applied thereon a capacitor structure constituted from a lower electrode, a dielectric layer formed on the lower electrode and an upper electrode formed on the dielectric layer, which process comprises the steps of:

forming a lower electrode on a substrate;

forming on the lower electrode a dielectric layer from a high dielectric constant material represented by the above formula (I); and forming on the dielectric layer an upper electrode to complete the capacitor structure.

In still another aspect thereof, the present invention resides in an electronic device comprising at least one electronic element and at least one capacitive element according to the present invention.

As will be described hereinafter, the present invention is characterized by utilizing in the formation of a dielectric layer of the capacitive element a dielectric material having the specified composition that exhibits enhanced voltage tunability of capacitance and capacitance density while maintaining low dielectric loss and low leakage. The present invention exploits a specific yttrium (Y)-modified composition range of the high dielectric constant material $(Ba_{(1-x)}Sr_x)Ti_{1+z}O_{3+\delta}$ to achieve superior voltage tunability of capacitance and capacitance density. Y is an amphoteric dopant to be included in the $ABO_3$ perovskite lattice and can substitute at either the A-site or the B-site depending on the A/B site ratio. If $(Ba+Sr)/Ti<1$, Y predominantly substitutes on the A site while for $(Ba+Sr)/Ti>1$, Y predominantly substitutes on the B-site. Site occupancy of the Y atom can be determined by X-ray diffraction measurements. In either case the valency of Y in the perovskite lattice is $Y^{+3}$ so for $(Ba+Sr)/Ti<1$ Y is a donor while $(Ba+Sr)/Ti>1$ Y is an acceptor type dopant.

DESCRIPTION OF THE PREFERRED EMBODIMENTS

Figure 1:
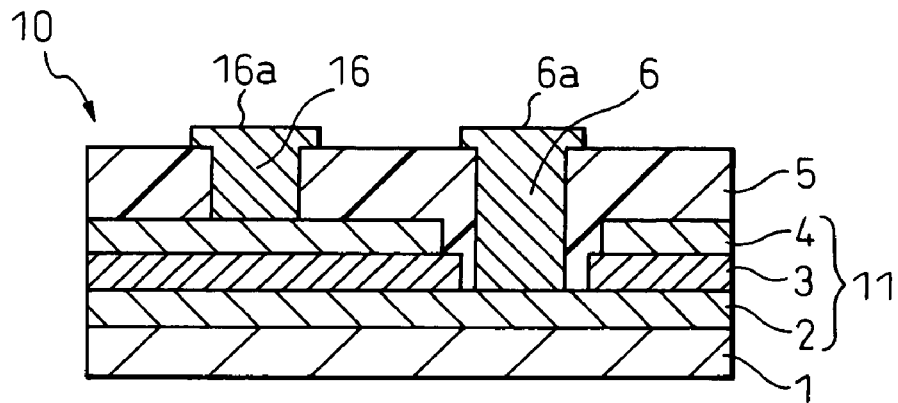
FIG. 1 is a cross-sectional view of the thin film capacitive element according to one preferred embodiment of the present invention.

The prior art capacitive elements described in the above section entitled "Description of the Related Art" of the specification suffer from many problems to be solved. One of the major problems resides in impeding the use of polycrystalline high dielectric constant oxide thin films, such as (Ba,Sr)TiO$_3$, in voltage tunable capacitance device applications or applications requiring high capacitance density and low dielectric loss. Accordingly, in the prior art capacitive elements, it is difficult to achieve high tunability of capacitance and/or capacitance density while maintaining low dielectric loss and low leakage. In this connection, in an ABO$_3$ oxide thin film, its voltage tunability of capacitance and high dielectric constant are derived from ionic displacements of the B-site cations in the ABO$_3$ perovskite lattice, and optimization of film stress have been considered to be important for achieving high voltage tunability of capacitance as well as high capacitance density. Improved film crystallinity can be achieved by increasing the processing temperature, however, higher temperature processing often leads to unacceptably high leakage and dielectric loss. Further, it is expected that film stress or strain can be controlled by growing films on lattice matched substrates. However, this severely restricts the variety of substrates usable for film deposition.

Accordingly, the present invention is directed to solve these prior art problems.

Therefore, one embodiment of the present invention resides in a thin film capacitive element which simultaneously ensures high voltage tunability of capacitance and high capacitance density.

Another embodiment of the present invention resides in a thin film capacitive element which ensures higher temperature processing without causing unacceptably high leakage and dielectric loss.

Further, another embodiment of the present invention resides in a thin film capacitive element which enables use of a wide variety of substrates.

Furthermore, another embodiment of the present invention resides in a thin film capacitive element which is useful in the production of electronic devices exhibiting high performance.

In addition, another embodiment of the present invention resides in a production process useful for the production of the capacitive element of the present invention.

Moreover, still another embodiment of the present invention resides in a high performance electronic device comprising the capacitive element of the present invention.

The present invention will be described hereinafter with regard to its preferred embodiments referring to the accompanying drawings. Note, however, that the present invention should not be restricted to the described embodiments, and it can be modified or improved within the scope and spirit of the present invention.

The capacitive element according to the present invention is a thin film capacitive element, and is preferably used as an integrated product of two or more capacitive elements. Basically, the capacitive element comprises a substrate having applied thereon a capacitor structure, and the capacitor structure is constituted from a bottom or lower electrode (lower electrode layer), a dielectric layer formed on the lower electrode and an upper electrode (upper electrode layer) formed on the dielectric layer. That is, in the capacitor structure, a dielectric layer is sandwiched between the lower electrode and the upper electrode.

A simplified example of the capacitive element according to one preferred embodiment of the present invention is illustrated in FIG. 1. As is illustrated, the capacitive element 10 comprises a substrate 1 such as silicon wafer and the substrate 1 has a capacitor structure 11 fabricated thereon. The capacitor structure 11 is constituted, from the substrate side, a lower electrode 2 such as Pt electrode, a dielectric layer 3 such as (BaSrY)TiO$_3$ layer and an upper electrode 4 such as Pt electrode. An upper surface of the capacitor structure 11 is protected with an insulating layer 5 formed from an insulating resin such as epoxy resin. Further, the insulating layer 5 has contact holes 6 and 16 each filled with a conductive metal such as Cu. A top surface of each of the contact holes 6 and 16 has an electrode pad 6a and 16a, respectively. The electrode pad 6a and 16a each can be applied with an external terminal such as solder bump (not shown). The external terminal is designed to receive any electric element such as semiconductor element, for example, LSI chip. Although not illustrated, the capacitive element 10 may comprise one or more additional layers in suitable site(s) thereof, if desired.

In the thin film capacitive element of the present invention, the dielectric layer constituting the capacitor structure may have a wide range of thickness depending upon the constitution and other factors of the capacitive element, electronic device and the like, and generally has a thickness of about 1 to 300 nm, preferably a thickness of about 10 to 300 nm.

The dielectric layer is preferably formed from a high dielectric constant material having a dielectric constant of the order of about 10 to 1,000. A high dielectric constant material suitable in the practice of the present invention is the high dielectric constant material represented by the following formula (I):

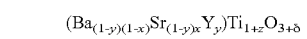

wherein $0<x<1$, $0.007<y<0.02$, $-1<\delta<0.5$, and $(Ba_{(1-y)(1-x)}+Sr_{(1-y)x})/Ti_{1+z}<1$.

More preferably, the high dielectric constant material used in the present invention is represented by the following formula (II):

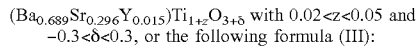
$(Ba_{0.689}Sr_{0.296}Y_{0.015})Ti_{1+z}O_{3+\delta}$ with $0.02<z<0.05$ and $-0.3<\delta<0.3$, or the following formula (III):

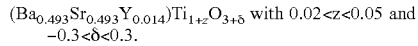
$(Ba_{0.493}Sr_{0.493}Y_{0.014})Ti_{1+z}O_{3+\delta}$ with $0.02<z<0.05$ and $-0.3<\delta<0.3$.

In addition to these high dielectric constant materials, to form the dielectric layer, although they are not restricted to the following, $BaTiO_3$, $SrTiO_3$, $(Ba, Sr)TiO_3$, $Pb(Zr, Ti)O_3$, $(Pb, La)(Zr, Ti)O_3$, $KNbO_3$, $Pb(Mg_{1/3}Nb_{2/3})O_3$ and a modified compound of these dielectric materials having incorporated therein a dopant may be used.

The usefulness of the high dielectric constant materials in the formation of the dielectric layer of the capacitive element according to the present invention will be appreciated from the graphs of the accompanying drawings (FIGS. 2 to 5).

Figure 2:
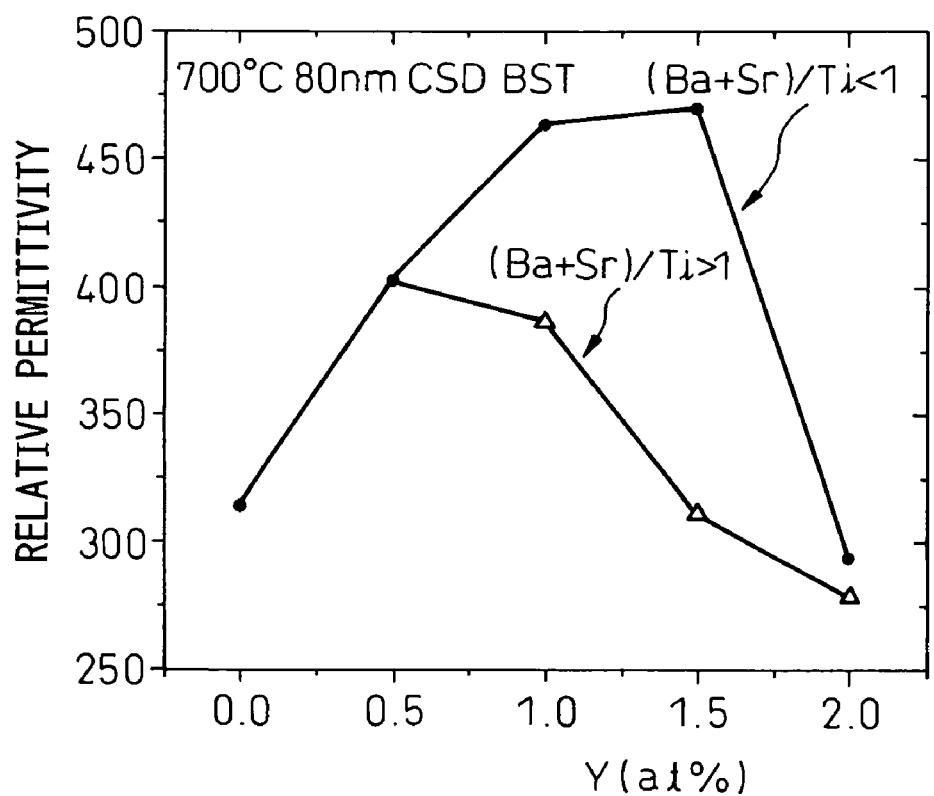
FIG. 2 is a graph plotting a relative permittivity versus atomic percent Y with (Ba+Sr)/Ti<1 and (Ba+Sr)/Ti>1 with Ba/Sr=7/3, z=0, and δ=0.

FIG. 2 shows the relative permittivity versus atomic percent Y for Y doping with $(Ba+Sr)/Ti<1$ and $(Ba+Sr)/Ti>1$ with the Ba/Sr ratio held fixed at 7/3 and $z=\delta=0$. As shown in FIG. 2, significant differences in the effect of Y doping on the capacitance density occur depending on whether $(Ba+Sr)/Ti<1$ Y or $(Ba+Sr)/Ti>1$ Y. Optimum relative permittivity is achieved for $(Ba+Sr)/Ti<1$ and $0.007<y<0.018$.

Figure 3:
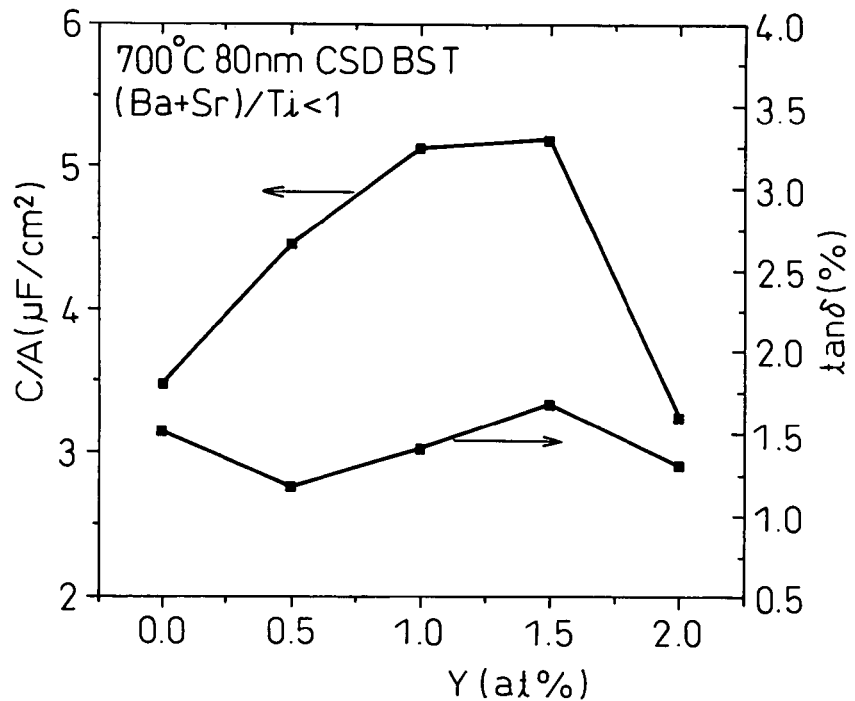
FIG. 3 is a graph plotting a capacitance density and loss tangent versus at % Y for the case (Ba+Sr)/Ti<1, Ba/Sr=7/3, z=0, and δ=0.

FIG. 3 shows the capacitance density and loss tangent versus at % Y for the case $(Ba+Sr)/Ti<1$, $Ba/Sr=7/3$, and $z=\delta=0$. As shown in FIG. 3, a 50% increase in permittivity at zero D.C bias without any degradation the dielectric loss is observed for 1.5 at % Y.

Figure 4:
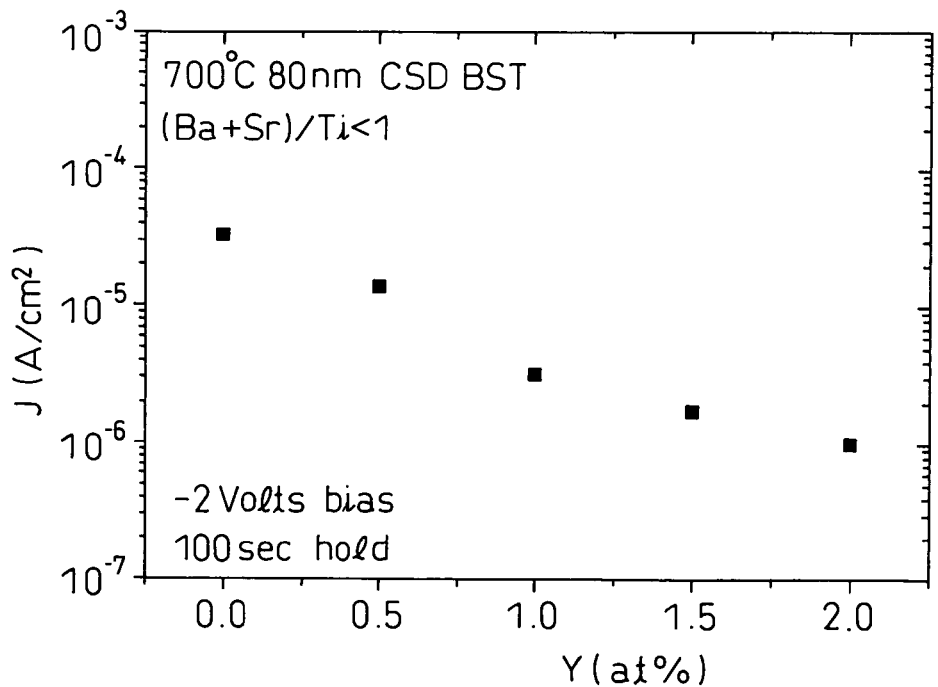
FIG. 4 is a graph plotting a leakage currents versus atomic percent Y for the case (Ba+Sr)/Ti<1, Ba/Sr=7/3, z=0, and δ=0.

FIG. 4 shows the leakage currents versus atomic percent Y for the case $(Ba+Sr)/Ti<1$, $Ba/Sr=7/3$, and $z=\delta=0$. As shown in FIG. 4, Y doping with $(Ba+Sr)/Ti<1$ improves leakage currents.

Figure 5:
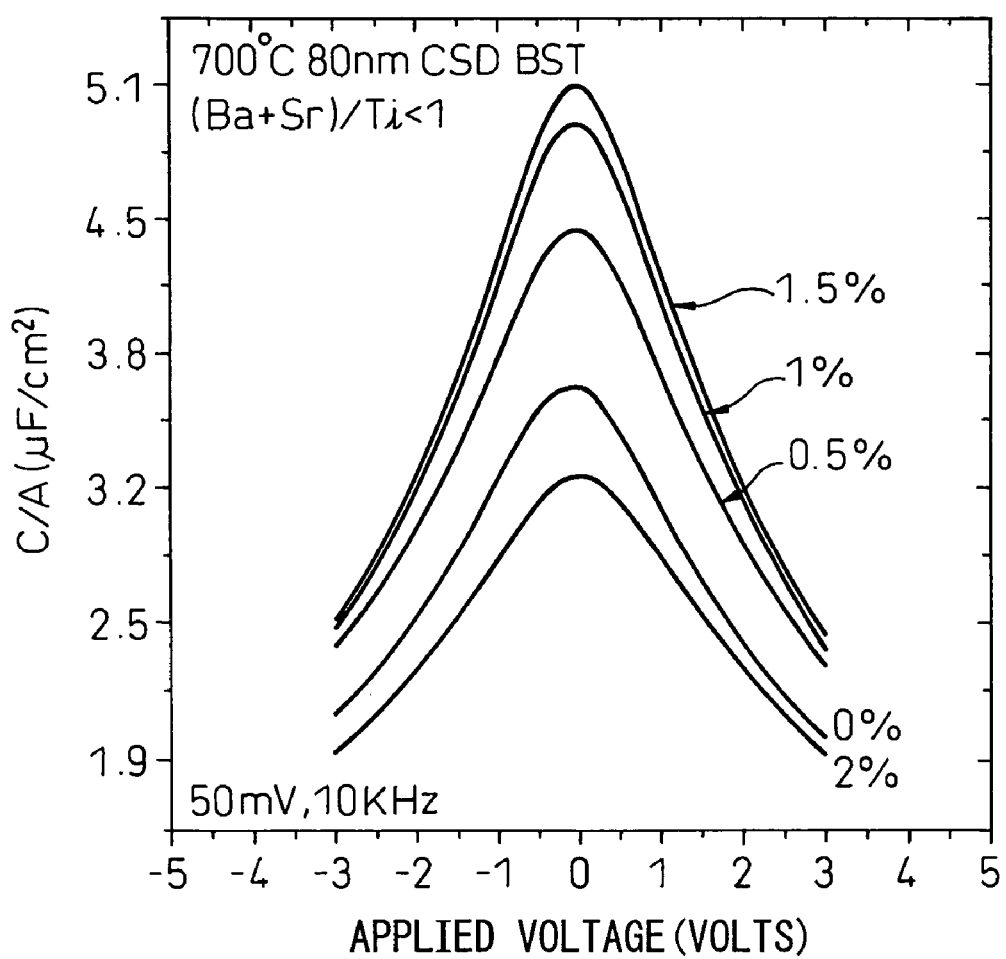
FIG. 5 is a graph plotting a voltage tunability of capacitance density as a function of at % Y for with (Ba+Sr)/Ti<1, Ba/Sr=7/3, z=0, and δ=0.

FIG. 5 shows the voltage tunability of capacitance density as a function of at % Y for $(Ba+Sr)/Ti<1$, $Ba/Sr=7/3$, and $z=\delta=0$. The specified Y-modified compositions not only increase the magnitude of the capacitance density at zero applied bias but also significantly improve the voltage tunability of capacitance since the additional capacitance due to the Y doping is nonlinear with applied voltage. The improvement in voltage tunability of capacitance is 12% at 1.5 at % Y.

Thus, as shown in FIGS. 2 to 5, for the specific composition range, Y doping significantly increases voltage tunability of capacitance and capacitance density while maintaining low leakage and dielectric loss resulting in superior device performance.

In the capacitive element of the present invention, the substrate may be formed from any suitable materials. Preferably, the substrate is formed from an electrically insulating material. Suitable insulating material includes, but is not restricted to, glass, semiconductor material and resinous material. A thickness of the substrate may vary widely, and preferably it is in the range of about 1 to 1,000 μm, more preferably in the range of about 100 to 500 μm.

In the practice of the present invention, a semiconductor material or wafer can be advantageously used as the insulating substrate. Preferably, the semiconductor material or wafer comprises at least one material selected from the group consisting of Si, Ge, SiGe, GaAs, InAs, InP and other compounds derived from the elements of Group III and V of the periodic table.

The capacitive element may further comprise one or more insulating layers applied over the substrate. The insulating layer may be formed from any insulating material, and it is preferably formed from an insulating material selected from the group consisting of oxides, nitrides or oxynitrides of metal, high dielectric constant metal oxides, xerogels, organic resin and combinations or mixtures thereof. The insulating layer may be used as a single layer or it may be used in the form of a multilayered structure. A thickness of the insulating layer may be widely varied, and preferably it is in the range of about 0.01 to 1,000 μm, more preferably in the range of about 0.01 to 100 μm.

The capacitive element may further comprise an adhesion layer between the substrate and the capacitor structure to increase an bonding power between these layers. Preferably, the adhesion layer is formed from at least one material selected from the group consisting of noble metals, alloys of noble metals, alloys of noble and non-noble metals, conductive oxides of noble metals, insulating metal oxides, insulating metal nitrides, conducting metal nitrides, and combinations or mixtures thereof. Typical examples of the adhesion layer-forming material include, but are not restricted to, Pt, Ir, Zr, Ti, TiOx, IrOx, PtOx, ZrOx, TiN, TiAlN, TaN and TaSiN in which x is a positive integer. The adhesion layer may be used as a single layer or it may be used in the form of a multilayered structure. A thickness of the adhesion layer may be widely varied, and preferably it is in the range of about 1 to 1,000 nm, more preferably in the range of about 1 to 100 nm.

In the capacitive element, the lower electrode can be formed using a wide variety of the electrically conductive materials. The lower electrode is preferably formed from at least one conductive material selected from the group consisting of transition metals, noble metals, alloys of noble metals, alloys of noble and non-noble metals, conductive oxides and combinations or mixtures thereof. Typical examples of the lower electrode-forming material include, but are not restricted to, Pt, Pd, Ir, Ru, Rh, Re, Os, Au, Ag, Cu, PtOx, IrOx and RuOx in which x is a positive integer. The lower electrode may be used as a single layer or it may be used in the form of a multilayered structure. A thickness of the lower electrode may be widely varied, and preferably it is in the range of about 1 to 1,000 nm, more preferably in the range of about 1 to 100 nm.

Further, the upper electrode can be formed using a wide variety of the electrically conductive materials. The upper electrode is preferably formed from at least one conductive material selected from the group consisting of transition metals, noble metals, alloys of noble metals, alloys of noble and non-noble metals, conductive oxides and combinations or mixtures thereof. Typical examples of the upper electrode-forming material include, but are not restricted to, Pt, Pd, Ir, Ru, Rh, Re, Os, Au, Ag, Cu, PtOx, IrOx, RuOx, $SrRuO_3$ and $LaNiO_3$ in which x is a positive integer. The upper electrode may be used as a single layer or it may be used in the form of a multilayered structure. A thickness of the upper electrode may be widely varied, and preferably it is in the range of about 1 to 1,000 nm, more preferably in the range of about 1 to 100 nm.

In addition to the above-described layers, the capacitive element may further comprise a passivating layer on the upper electrode. Suitable examples of the passivating layer include a silicon nitride layer, a silicon oxide ($SiO_2$) layer, an aluminum oxide (alumina) layer and others. Preferably, a silicon nitride layer is used. A thickness of the passivating layer may be widely varied, and preferably it is in the range of about 1 to 1,000 nm, more preferably in the range of about 1 to 100 nm.

In the capacitive element of the present invention, the capacitor structure may be fabricated thereon or therein alone or, preferably, two or more capacitor structures may be fabricated in combination. In the latter, the capacitive element may comprise at least two capacitor structures connected in series or in parallel.

In addition to the capacitive element described above, the present invention resides in a production process of the present capacitive element. As described above, the production process comprises the steps of:

forming a lower electrode on a substrate;

forming on the lower electrode a dielectric layer from a high dielectric constant material represented by the above formula (I); and forming on the dielectric layer an upper electrode to complete said capacitor structure.

The production process according to the present invention can be advantageously carried out in different embodiments. Preferably, the process may further comprise additional steps such as the step of forming an insulating layer over the substrate, the step of forming an adhesion layer between the substrate and the lower electrode, and the step of forming a passivating layer on the upper electrode, for example. More preferably, the production process may further comprise the step of annealing the capacitive element in an oxygen-containing ambient atmosphere at a temperature of 100 to 900° C. Of course, these additional steps may be used alone or in combination.

The above production process of the capacitive element can be advantageously carried out by using or modifying any conventional processes well-known in the production of capacitors and other devices, such as photolithographic process, sputtering, etching and the like, and thus detailed description of the method used in each step will be omitted herein.

For the reference, the capacitive element shown in FIG. 1 can be advantageously produced in accordance with the manner described in sequence in FIGS. 6A to 6H.

Figure 6A:
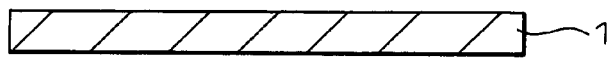
FIGS. 6A to 6H are cross-sectional views illustrating in sequence the production process of the thin film capacitive element of FIG. 1.

First, as shown in FIG. 6A, a silicon substrate 1 is prepared as a supporting substrate. Next, a lower electrode layer 2 composed of platinum (Pt) shown in FIG. 6B, a dielectric layer 3 composed of a composite oxide shown in FIG. 6C and an upper electrode layer 4 composed of platinum shown in FIG. 6D are formed in this order on the substrate 1 to form a capacitor structure indicated with the reference numeral 11 in FIG. 1. A metal oxide with a high dielectric constant may be advantageously used as the material for the dielectric layer 3 to achieve a miniaturized size and large capacitance. Metal oxides suitable for the practice of the present invention were mentioned above. Precious metals such as platinum (Pt) or Iridium (Ir) may be advantageously used as the electrode-proving materials (materials for forming the lower electrode layer 2 and upper electrode layer 4 of the capacitor structure 11), since they have excellent oxidation resistance in high temperature environments and allow satisfactory crystal orientation control during formation of the dielectric layer 3.

Specifically, the series of fabrication steps may be carried out in the following manner.

Figure 6B:
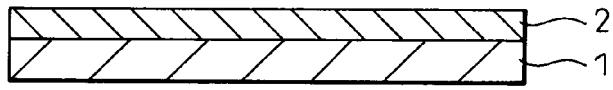

For the step of forming the lower electrode layer 2 shown in FIG. 6B, first a silicon wafer is used as the silicon substrate 1, and a sputtering method is used to form layers of titanium oxide ($TiO_2$; 20 nm) and platinum (Pt) in this order on the silicon wafer 1. The titanium oxide ($TiO_2$; 20 nm) may also serve the role of an adhesion layer (joining layer) between the silicon (Si) and platinum (Pt).

The sputtering conditions for titanium oxide ($TiO_2$) may be, for example, a substrate temperature of about 500° C., an RF power of about 200 W, a gas pressure of about 0.1 Pa and an $Ar/O_2$ ratio of 7/1.

The sputtering conditions for the platinum (Pt) may be, for example, a substrate temperature of about 400° C., a DC power of about 100 W and a gas pressure of about 0.1 Pa.

Figure 6C:
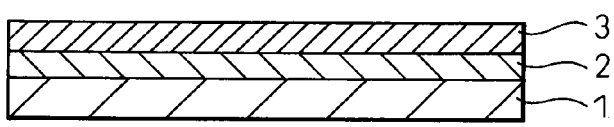
Figure 6D:
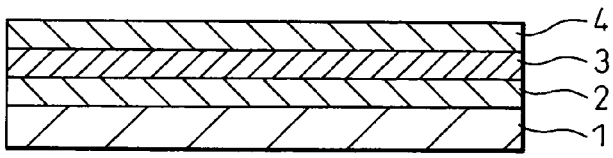

In the step of forming a dielectric layer 3 shown in FIG. 6C, a metal oxide composed of barium (Ba), strontium (St), yttrium (Y) and titanium (Ti) according to the present invention, particularly the material of the above-described formula (I): $(Ba_{(1-y)(1-x)}Sr_{(1-y)x}Y_y)Ti_{1+z}O_{3+\delta}$ is used as the dielectric material, and the dielectric layer 3 is formed by a sol-gel method. Alternatively, a sputtering method may be used.

Specifically, an alkoxide starting solution is first applied by spin coating (for example, 2,000 rpm/30 seconds) to form a layer. An approximately 100 nm thick film is obtained through on spin coating step under these spin coating conditions.

The resulting film is then prebaked for 10 minutes at a temperature of, for example, about 400° C., and subjected to main baking for 10 minutes at a temperature of, for example, about 700° C. to crystallize the metal oxide. A dielectric layer 3 with a thickness of 100 nm, a dielectric constant of 300 and a dielectric loss of no greater than 2% is thus obtained.

As in the formation of the lower electrode layer 2, a sputtering method is used in the step of forming an upper electrode layer 4 shown in FIG. 6D. Platinum (Pt) layer having a thickness of 100 nm is formed as the upper electrode layer 4 on the dielectric layer 3.

Referring again to FIG. 1, the side of the capacitor structure 11 is formed in a stepwise fashion wherein the edge of the lower layer extends outward beyond the edge of the lower layer, as illustrated. By providing such stepwise extending sections in the capacitor structure 11, it is possible to prevent the adverse effects of fragments (particles) at the extending sections, when fragments of the platinum material are produced during the production process, thereby preventing adhesion of the fragments onto the dielectric layer and avoiding short-circuits between the electrodes.

Figure 6E:
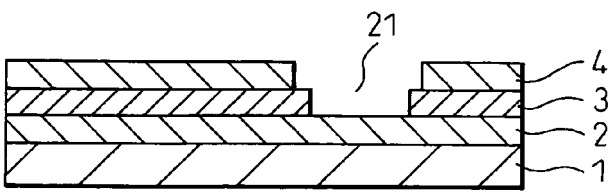

Next, as shown in FIG. 6E, an electrode-forming hole 21 for guiding an electrode from the lower electrode 2 is formed. Specifically, a resist mask is formed by photolithography, and then the Pt of the upper electrode layer 4 and the underlying dielectric layer 3 are dry etched in that order by argon (Ar) ion milling.

Note that, in the prior art method, it was common to form the electrode connection-forming hole 21 in the above manner, followed by formation of a barrier layer by sputtering of silicon nitride ($Si_3N_4$) or the like so as to cover both the top and side of the capacitor structure 11, whereas such a step increasing a number of the processing steps can be omitted according to the present invention. Of course, although not illustrated herein, if desired, after formation of the electrode connection-forming hole 21, a barrier layer may be formed in accordance with the above manner. For example, silicon nitride ($Si_3N_4$) can be sputtered at a thickness of about 150 μm to form a barrier layer or, alternatively, other barrier layer-providing materials such as aluminum oxide ($Al_2O_3$) or silicon dioxide ($SiO_2$) may be used.

Figure 6F:
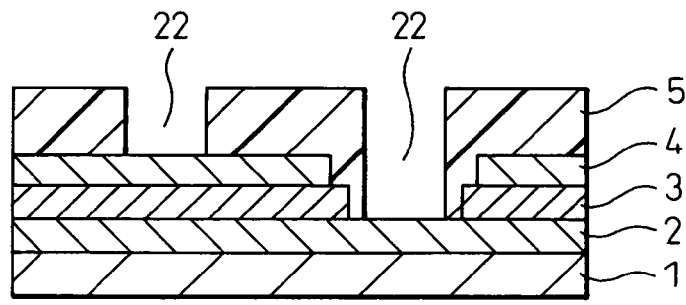

Subsequently, as shown in FIG. 6F, a protective insulating layer 5 consisting of polyimide resin or the like is formed on the capacitor structure 11 so as to cover it.

Specifically, in the formation of the protective insulating layer 5, a varnish of the photosensitive polyimide resin is spin coated, for example, at 3,000 rpm for 30 seconds, to form a 4 µm thick resin layer. This is followed by heating (prebaking) the resin layer for 10 minutes at a temperature of 60° C. After the exposure and development steps, the developed resin layer is subjected to heating (main baking) for 2 hours at a temperature of 400° C. A 2 µm thick protective insulating layer 5 consisting of the polyimide resin is thus obtained.

Next, contact holes 22 are selectively formed at desired locations of the protective insulating layer 5, as shown in FIG. 6F. Specifically, a resist mask (not shown) is formed by photolithography, and then dry etching is carried out through the resist mask by argon (Ar) ion milling to selectively remove the unnecessary sections of the protective insulating layer 5 to thus expose the lower electrode layer 2.

The next step is the formation of the electrode pads and bumps.

Figure 6G:
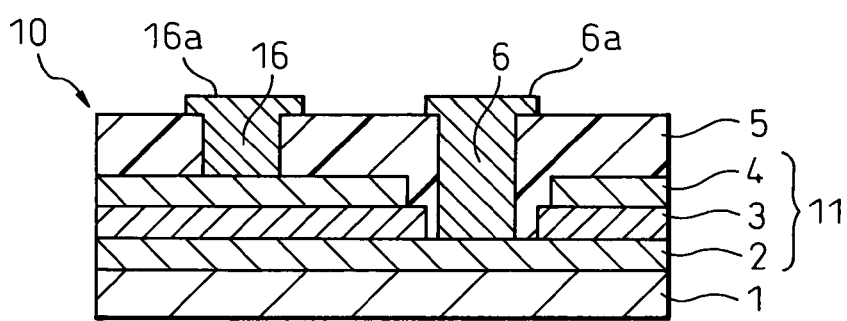

As shown in FIG. 6G, an electrically conductive material such as copper (Cu) is embedded in the contact holes 22, by plating, to form embedded Cu wiring layers 6 and 16. On the embedded Cu wiring layers 6 and 16, there are formed electrode pads 6a and 16a, respectively, by sputtering as under bump metal (UBM) for connecting each of the electrode layers of the capacitor structure 11 with the bumps.

Figure 6H:
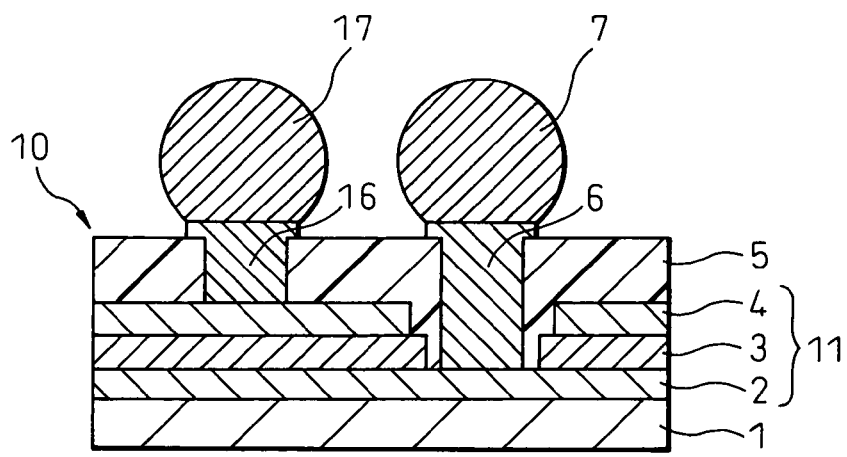

Finally, as shown in FIG. 6H, bumps 7 and 17 are formed on the previously formed electrode pads 6a and 16a, respectively, as terminals for electrical connection with a circuit board. In the conventional methods, solder is generally used as the material for the bumps, but it can diffuse into the electrode pads and then react with the platinum (Pt) of the electrode layers, thereby altering the resistance value of the electrode layers. To avoid this problem, it is preferred to use materials other than solder in the formation of the bumps. Suitable examples of the bump-providing material include, but are not restricted to, chromium (Cr), titanium (Ti), copper (Cu), nickel (Ni) or the like from the standpoint of avoiding the solder corrosion and improving the solder wettability.

The thin film capacitive element 10 shown in FIG. 1 can be produced by the production process described above with reference to FIGS. 6A to 6H. In the thin film capacitive element 10, it becomes possible to physically separate the capacitor structure 11 from the protective insulating layer 5 which is constituted from a moisture-absorbing polyimide resin capable of releasing water under the certain conditions. That is, according to the present invention, it is possible to prevent the problem that water or moisture released from the polyimide resin reaches a surface of the upper electrode layer 4 formed from platinum (Pt) having a catalytic function, because before ionization thereof, the water or moisture released from the polyimide resin is shut off from the migration to the surface of the upper electrode layer 4. Accordingly, it becomes possible to avoid the problem concerning reduction of the metal oxide constituting the dielectric layer 3 at the interface between the upper electrode layer 4 and the dielectric layer 3. Application of such a constitution to the thin film capacitive element makes it possible to provide a thin film capacitive element with an excellent high frequency tracking performance and a low degradation of characteristics.

Moreover, the present invention resides in an electronic device comprising the capacitive element of the present invention described above. In the electronic device of the present invention, the number of the capacitive element to be applied to the device, the method of applying the capacitive element, sites to which the capacitive element is applied and other conditions are not restrictive. For example, the capacitive element may be mounted on a surface of the device, may be introduced in an interior of the device or may be a combination thereof. That is, the electronic device of the present invention is basically characterized by comprising at least one electronic element and at least one capacitive element according to the present invention.

In the electronic element of the present invention, the electronic element to be fabricated therein and/or thereon is not restricted to the specific one. Suitable examples of the electronic element include, but are not restricted to, conventional capacitors, resistors, inductors, semiconductor elements such as LSI chips and VLSI chips, wirings, circuits, electrode and the like. Thus, the electronic device of the present invention includes wide variety types of electronic devices such as a semiconductor devices and the like. Typical examples of the electronic devices include, but are not restricted to, microwave and RF devices, charge storage devices for decoupling capacitor, DRAM devices and others.

As described above, the thin film capacitive elements of the present invention, when they are applied in combination of two or more elements to an electronic device, may be electrically connected either in series or in parallel.

Figure 7:
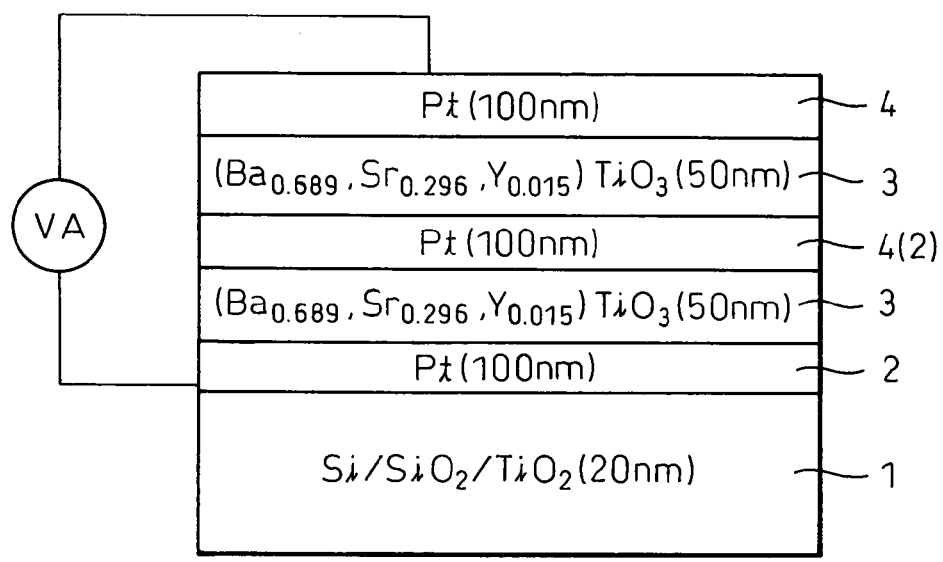
FIG. 7 is a cross-sectional view of the electronic device according to one preferred embodiment of the present invention.

FIG. 7 is a cross-sectional view of the electronic device according to one preferred embodiment of the present invention in which the capacitive elements are connected in series. As is illustrated, the thin film capacitive element comprises a first capacitive element consisting of a lower electrode layer 2, a dielectric layer 3 and an upper electrode layer 4 on a silicon substrate 1 produced upon processing of the silicon wafer, and also a second capacitive element (lower electrode layer 2, dielectric layer 3 and upper electrode layer 4) connected in series to the first capacitive element. The in series connection of the capacitive elements enables to totally reduce a capacitance in the electronic device.

Figure 8:
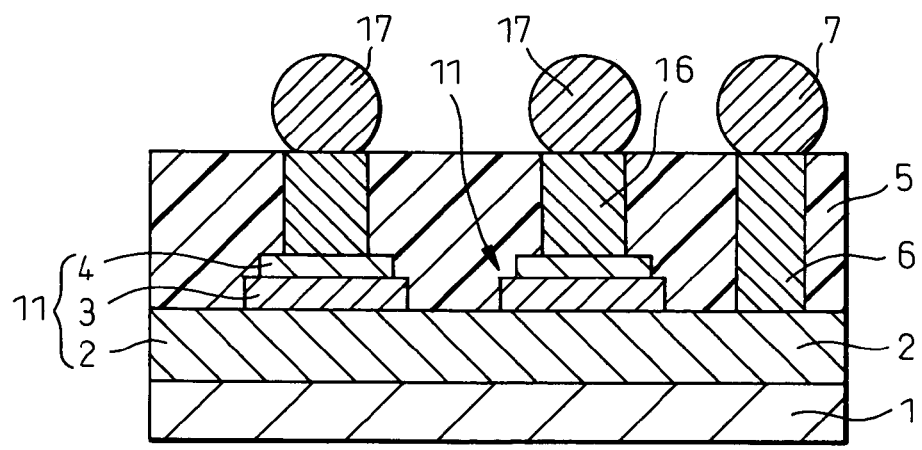
FIG. 8 is a cross-sectional view of the electronic device according to another preferred embodiment of the present invention.

FIG. 8 is a cross-sectional view of the electronic device according to another preferred embodiment of the present invention in which the capacitive elements are connected in parallel. As illustrated, two capacitor structures 11 are connected in parallel in the electronic device. As described above with reference to FIG. 6A to 6H, each capacitive structure 11 is constituted from a lower electrode layer 2, a dielectric layer 3 and an upper electrode layer 4. Further, each capacitor structure 11 is connected through an electrode pad 6(16) to a bump 7(17), and is sealed with a protective insulating layer 5.

EXAMPLES

The present invention will be further described with reference to the examples thereof. Note, however, that the present invention should not be restricted to these examples.

Example 1

Figure 9:
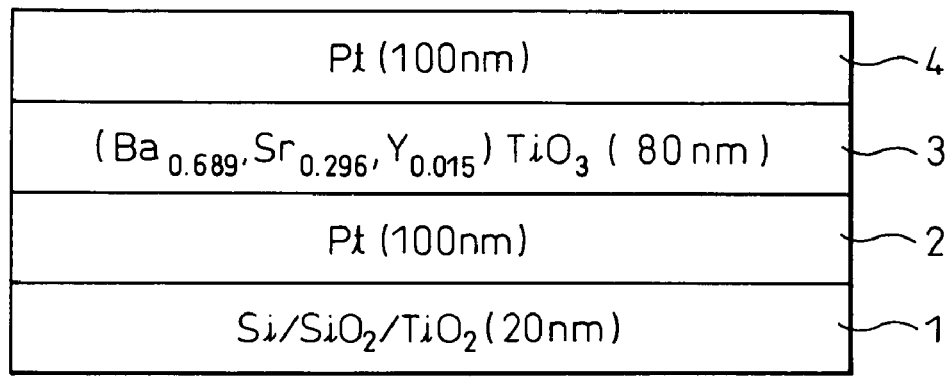
FIG. 9 is a cross-sectional view of the Y-modified BSTO capacitor structure produced in Example 1.

In this example, the thin film capacitive element having the layer structure illustrated in FIG. 9 was produced. As is illustrated in FIG. 9, the capacitive element is provided with a capacitor structure consisting of a lower electrode layer 2, a dielectric layer 3 and an upper electrode layer 4 on a silicon substrate 1 formed by fabricating a silicon wafer.

After Si substrate was thermally oxidized to form a silicon oxide ($SiO_2$) layer on a surface thereof, an adhesion layer of $TiO_2$ was deposited by a vapor deposition method on the thermally oxidized Si substrate. RF magnetron sputtering method was used as the vapor deposition method. Then, Pt was deposited by the RF magnetron sputtering method to form a lower electrode layer having a thickness of about 100 nm.

After formation of the lower electrode layer, a yttrium (Y)-modified composition of barium strontium titanate $(Ba_{0.689}Sr_{0.296}Y_{0.015})TiO_3$ as a starting material was deposited by a chemical solution deposition (CSD) method. Specifically, the solution of the Y-modified BST composition was spin coated at a predetermined thickness on the lower electrode layer and baked on a hot plate at 350° C. in air for 5 minute. Subsequently, the resulting CSD $(Ba_{0.689}Sr_{0.296}Y_{0.015})TiO_3$ film was subjected to rapid thermal annealing at 700° C. for 5 minutes for crystallization. The resultant BSYTO film had a thickness of about 80 nm. Next, a 100 nm thick upper electrode layer consisting of platinum (Pt) was produced using the RF magnetron sputtering method as in the above-described formation of the lower electrode layer. Then, the lower electrode layer, the dielectric layer (BSYTO film) and the upper electrode layer were etched by using the standard photolithographic process. The capacitive element shown in FIG. 9 was thus produced.

Figure 10:
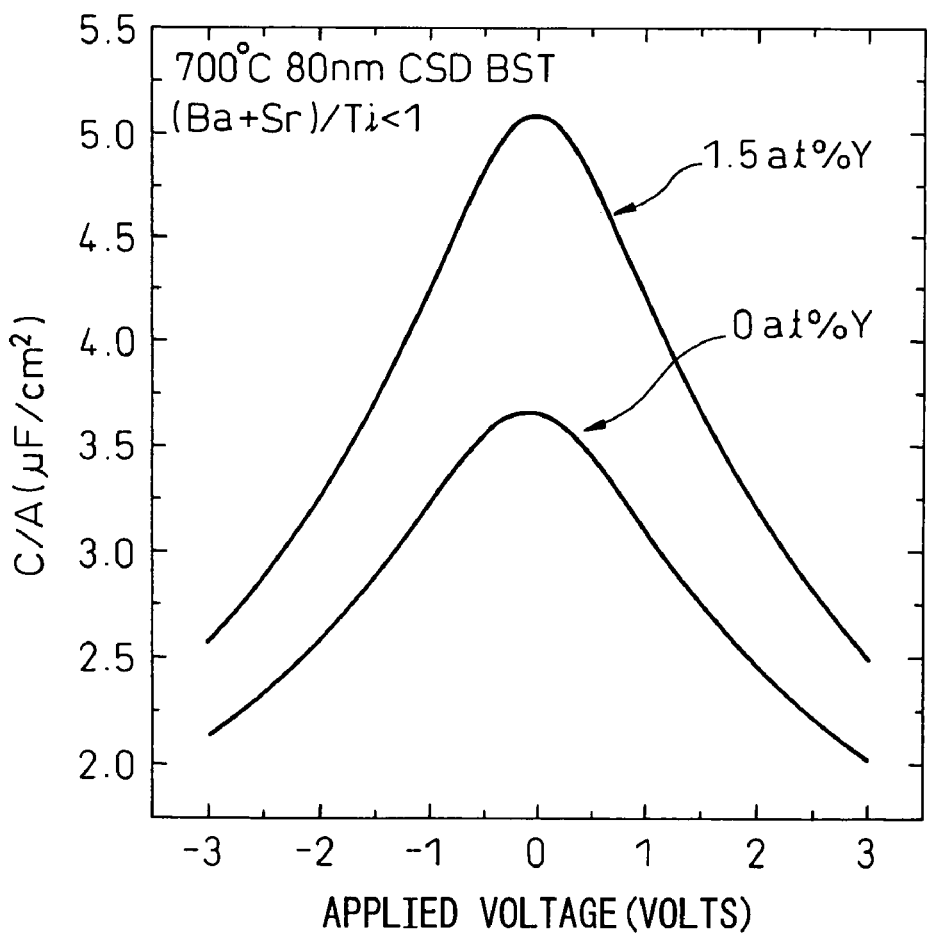
FIG. 10 is a graph plotting a voltage tunability of capacitance for a 1.5 at % Y-modified BSTO film with (Ba+Sr)/Ti<1, Ba/Sr=7/3, z=0, and δ=0, concerning the capacitor structure of FIG. 9.

With regard to the produced capacitive element, the tunability of capacitance was determined to obtain a graph plotted in FIG. 10. It is appreciated from FIG. 10 that significant improvement in voltage tunability of capacitance and magnitude of the capacitance density at zero applied bias could be achieved.

Example 2

The procedure of Example 1 was repeated to produce the following thin film capacitive element.

After Si substrate was thermally oxidized to form a silicon oxide $(SiO_2)$ layer on a surface thereof, an adhesion layer of $TiO_2$ was deposited by a RF magnetron sputtering method on the thermally oxidized Si substrate. Then, Pt was deposited by the RF magnetron sputtering method to form a lower electrode layer having a thickness of about 100 nm.

After formation of the lower electrode layer, a yttrium (Y)-modified composition of barium strontium titanate $(Ba_{0.493}Sr_{0.493}Y_{0.014})Ti_{1+z}O_{3+\delta}$ as a starting material was deposited by a chemical solution deposition (CSD) method. Specifically, the solution of the Y-modified BST composition was spin coated at a predetermined thickness on the lower electrode layer and baked on a hot plate at 350° C. in air for 5 minute. Subsequently, the resulting CSD $(Ba_{0.493}Sr_{0.493}Y_{0.014})Ti_{1+z}O_{3+\delta}$ film was subjected to rapid thermal annealing at 700° C. for 5 minutes for crystallization. The resultant BSYTO film had a thickness of about 80 nm. Next, a 100 nm thick upper electrode layer consisting of platinum (Pt) was produced using the RF magnetron sputtering method as in the above-described formation of the lower electrode layer. Then, the lower electrode layer, the dielectric layer (BSYTO film) and the upper electrode layer were etched by using the standard photolithographic process to produce the target capacitive element.

With regard to the produced capacitive element, the tunability of capacitance was determined. Significant improvement in both of the voltage tunability of capacitance and the magnitude of the capacitance density at zero applied bias could be achieved as in Example 1.

Example 3

The procedure of Example 1 was repeated to produce the following thin film capacitive element.

After Si substrate was thermally oxidized to form a silicon oxide $(SiO_2)$ layer on a surface thereof, an adhesion layer of $TiO_2$ was deposited by a RF magnetron sputtering method on the thermally oxidized Si substrate. Then, Pt was deposited by the RF magnetron sputtering method to form a lower electrode layer having a thickness of about 100 nm.

After formation of the lower electrode layer, a yttrium (Y)-modified composition of barium strontium titanate $(Ba_{0.689}Sr_{0.296}Y_{0.015})TiO_3$ as a starting material was deposited by the RF Magnetron sputtering method. The sputtering conditions were as follows: a substrate temperature of 550° C., RF power of 100 W, $Ar/O_2$ ratio of 30/3.7, and pressure of 10 mTorr. The resultant BSYTO film had a thickness of about 100 nm. Next, a 100 nm thick upper electrode layer consisting of platinum (Pt) was produced using the RF magnetron sputtering method as in the above-described formation of the lower electrode layer. Then, the lower electrode layer, the dielectric layer (BSYTO film) and the upper electrode layer were etched by using the standard photolithographic process to produce the target capacitive element.

With regard to the produced capacitive element, the tunability of capacitance was determined. Significant improvement in both of the voltage tunability of capacitance and the magnitude of the capacitance density at zero applied bias could be achieved as in Example 1.

As described above, according to the present invention, there is provided a thin film capacitive element which simultaneously ensures high voltage tunability of capacitance and high capacitance density. Further, the capacitive element ensures higher temperature processing without causing unacceptably high leakage and dielectric loss. Furthermore, the capacitive element enables to use a wide variety of substrates. The capacitive element is useful in the production of electronic devices exhibiting high performance.

In addition, according to the present invention, there is provided a production process useful for the production of the capacitive element of the present invention.

Moreover, according to the present invention, there is provided a high performance electronic device comprising the capacitive element of the present invention.

What is claimed is:

1. A thin film capacitive element comprising a substrate having applied thereon a capacitor structure constituted from a lower electrode, a dielectric layer formed on the lower electrode and an upper electrode formed on the dielectric layer, in which said dielectric layer comprises a high dielectric constant material represented by the following formula (I):

$$(Ba_{(1-y)(1-x)}Sr_{(1-y)x}Y_y)Ti_{1+z}O_{3+\delta}$$

wherein $0<x<1$, $0.007<y<0.02$, $-1<\delta<0.5$, and 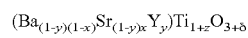$(Ba_{(1-y)(1-x)}+Sr_{(1-y)x})/Ti_{1+z}<1$.

2. The capacitive element according to claim 1 wherein said dielectric layer has a thickness of 1 to 300 nm.

3. The capacitive element according to claim 1 wherein said substrate comprises an insulating material selected from the group consisting of a glass, semiconductor material and resinous material.

4. The capacitive element according to claim 1 wherein said substrate comprises a semiconductor material or wafer.

5. The capacitive element according to claim 4 wherein said semiconductor material or wafer comprises at least one material selected from the group consisting of Si, Ge, SiGe, GaAs, InAs, InP and other compounds derived from the elements of Group III and V of the periodic table.

6. The capacitive element according to claim 1 which further comprises at least one insulating layer applied over said substrate, and said insulating layer comprises an insulating material selected from the group consisting of oxides, nitrides or oxynitrides of metal, high dielectric constant metal oxides, xerogels, organic resin and combinations or mixtures thereof.

7. The capacitive element according to claim 6 in which said insulating layer has a multilayered structure.

8. The capacitive element according to claim 1 which further comprises an adhesion layer between said substrate and said capacitor structure, and said adhesion layer comprises at least one material selected from the group consisting of noble metals, alloys of noble metals, alloys of noble and non-noble metals, conductive oxides of noble metals, insulating metal oxides, insulating metal nitrides, conducting metal nitrides, and combinations or mixtures thereof.

9. The capacitive element according to claim 8 wherein said adhesion layer comprises at least one material selected from the group consisting of Pt, Ir, Zr, Ti, TiOx, IrOx, PtOx, ZrOx, TiN, TiAlN, TaN and TaSiN in which x is a positive integer.

10. The capacitive element according to claim 8 in which said adhesion layer has a multilayered structure.

11. The capacitive element according to claim 1 wherein said lower electrode comprises at least one material selected from the group consisting of transition metals, noble metals, alloys of noble metals, alloys of noble and non-noble metals, conductive oxides and combinations or mixtures thereof.

12. The capacitive element according to claim 1 wherein said lower electrode comprises at least one material selected from the group consisting of Pt, Pd, Ir, Ru, Rh, Re, Os, Au, Ag, Cu, PtOx, IrOx and RuOx in which x is a positive integer.

13. The capacitive element according to claim 1 in which said lower electrode has a multilayered structure.

14. The capacitive element according to claim 1 in which said high dielectric constant material is a material represented by the following formula (II):

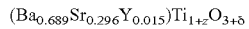
$(Ba_{0.689}Sr_{0.296}Y_{0.015})Ti_{1+z}O_{3+\delta}$ wherein $0.02 < z < 0.05$ and $-0.3 < \delta < 0.3$.

15. The capacitive element according to claim 1 in which said high dielectric constant material is a material represented by the following formula (III):

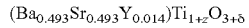
$(Ba_{0.493}Sr_{0.493}Y_{0.014})Ti_{1+z}O_{3+\delta}$ wherein $0.02 < z < 0.05$ and $-0.3 < \delta < 0.3$.

16. The capacitive element according to claim 1 wherein said upper electrode comprises at least one material selected from the group consisting of transition metals, noble metals, alloys of noble metals, alloys of noble and non-noble metals, conductive oxides and combinations or mixtures thereof.

17. The capacitive element according to claim 1 wherein said upper electrode comprises at least one material selected from the group consisting of Pt, Pd, Ir, Ru, Rh, Re, Os, Au, Ag, Cu, PtOx, IrOx, RuOx, SrRuO₃ and LaNiO₃ in which x is a positive integer.

18. The capacitive element according to claim 1 in which said upper electrode has a multilayered structure.

19. The capacitive element according to claim 1 which further comprises a passivating layer on said upper electrode.

20. The capacitive element according to claim 19 in which said passivating layer comprises a silicon nitride layer.

21. The capacitive element according to claim 1 which comprises at least two capacitor structures connected in series.

22. The capacitive element according to claim 1 which comprises at least two capacitor structures connected in parallel.

23. A process for the production of a thin film capacitive element comprising a substrate having applied thereon a capacitor structure constituted from a lower electrode, a dielectric layer formed on the lower electrode and an upper electrode formed on the dielectric layer, which process comprises the steps of:

forming a lower electrode on a substrate;

forming on said lower electrode a dielectric layer from a high dielectric constant material represented by the following formula (I):

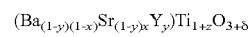
$(Ba_{(1-y)(1-x)}Sr_{(1-y)x}Y_y)Ti_{1+z}O_{3+\delta}$ wherein $0 < x < 1$, $0.007 < y < 0.02$, $-1 < \delta < 0.5$, and $(Ba_{(1-y)(1-x)} + Sr_{(1-y)x})/Ti_{1+z} < 1$; and forming on said dielectric layer an upper electrode to complete said capacitor structure.

24. The process for the production of a thin film capacitive element according to claim 23 in which said dielectric layer is formed at a thickness of 1 to 300 nm.

25. The process for the production of a thin film capacitive element according to claim 23 which further comprises the step of forming an insulating layer over said substrate.

26. The process for the production of a thin film capacitive element according to claim 23 which further comprises the step of forming an adhesion layer between said substrate and said lower electrode.

27. The process for the production of a thin film capacitive element according to claim 23 which further comprises the step of forming a passivating layer on said upper electrode.

28. The process for the production of a thin film capacitive element according to claim 23 which further comprises the step of annealing said capacitive element in an oxygen-containing ambient atmosphere at a temperature of 100 to 900° C.

29. An electronic device comprising at least one electronic element and at least one capacitive element described in any one of claims 1 to 22.

30. The electronic device according to claim 29 in which said electronic element is one member selected from the group consisting of capacitors, resistors, inductors, semiconductor elements, wirings, circuits and electrodes.

* * * * *